United States Patent [19]

Dumoulin et al.

[11] Patent Number: 5,307,808
[45] Date of Patent: May 3, 1994

[54] TRACKING SYSTEM AND PULSE SEQUENCES TO MONITOR THE POSITION OF A DEVICE USING MAGNETIC RESONANCE

[75] Inventors: Charles L. Dumoulin, Ballston Lake, N.Y.; Steven P. Souza, Williamstown, Mass.; Robert D. Darrow, Scotia, N.Y.

[73] Assignee: General Electric Company, Schenectady, N.Y.

[21] Appl. No.: 861,718

[22] Filed: Apr. 1, 1992

[51] Int. Cl.$^5$ ............................................. A61B 5/055
[52] U.S. Cl. .............................. 128/653.2; 128/653.5; 128/658
[58] Field of Search .................. 128/653.2, 653.5, 899, 128/658

[56] References Cited

U.S. PATENT DOCUMENTS

| | | | |
|---|---|---|---|
| 4,254,778 | 3/1981 | Clow et al. | 128/653.002 |
| 4,572,198 | 2/1986 | Codrington | 128/653.002 |
| 4,613,837 | 9/1986 | Blass et al. | 128/653.005 |
| 4,638,252 | 1/1987 | Bradshaw | 128/653.005 |
| 4,672,972 | 6/1987 | Berke | 128/653.005 |
| 4,799,015 | 1/1989 | Sepponen | 128/653.002 |
| 4,889,127 | 12/1989 | Takeda et al. | 128/653.002 |
| 4,962,763 | 10/1990 | Sato et al. | 128/653.002 |
| 4,966,149 | 10/1990 | Stokar | 128/653.002 |
| 4,989,608 | 2/1991 | Ratner | 128/653.002 |
| 4,995,394 | 2/1991 | Cline et al. | 128/653.002 |
| 5,005,592 | 4/1991 | Cartmell | 128/899 |
| 5,042,486 | 8/1991 | Pfeiler et al. | 128/653.001 |
| 5,099,845 | 3/1992 | Besz et al. | 128/899 |
| 5,107,862 | 4/1992 | Fabian et al. | 128/899 |
| 5,170,789 | 12/1992 | Narayan et al. | 128/653.5 |

FOREIGN PATENT DOCUMENTS 0385367 9/1990 European Pat. Off. .
3937052 5/1990 Fed. Rep. of Germany .

Primary Examiner—William E. Kamm
Assistant Examiner—Brian L. Casler
Attorney, Agent, or Firm—Lawrence P. Zale; Marvin Snyder

[57] ABSTRACT

A tracking system employs magnetic resonance signals to monitor the position of a device such as a catheter within a subject. The device has a receiver coil which is sensitive to magnetic resonance signals generated in the subject. These signals are detected in the presence of magnetic field gradients and thus have frequencies which are substantially proportional to the location of the coil along the direction of the applied gradient. Signals are detected responsive to sequentially applied mutually orthogonal magnetic gradients to determine the position of the device in several dimensions. The position of the device as determined by the tracking system is superimposed upon independently acquired medical diagnostic images.

15 Claims, 9 Drawing Sheets

TRACKING SYSTEM AND PULSE SEQUENCES TO MONITOR THE POSITION OF A DEVICE USING MAGNETIC RESONANCE

CROSS REFERENCES TO RELATED APPLICATIONS

This application is related to U.S. patent applications TRACKING SYSTEM TO MONITOR THE POSITION AND ORIENTATION OF A DEVICE USING MAGNETIC RESONANCE DETECTION OF A SAMPLE CONTAINED WITHIN THE DEVICE, Ser. No. 07/861,662 and TRACKING SYSTEM TO MONITOR THE POSITION AND ORIENTATION OF A DEVICE USING MULTIPLEXED MAGNETIC RESONANCE DETECTION, Ser. No. 07/861,640 by Dr. Charles L. Dumoulin, Dr. Steven P. Souza and Robert Darrow all assigned to the present assignee, hereby incorporated by reference, and filed simultaneously with this application.

1. FIELD OF THE INVENTION

The present invention relates to medical procedures in which a device is inserted into a body, and more particularly concerns tracking of such device with the use of magnetic resonance signals.

2. DESCRIPTION OF RELATED ART

X-ray fluoroscopes are used routinely to monitor placement of devices during diagnostic and therapeutic medical procedures. Conventional X-ray fluoroscopes are designed to minimize X-ray dosage. Nevertheless, some procedures can be very long and the accumulated X-ray dose to the subject can become significant. The long term exposure of the attending medical staff is of even greater concern since they participate in these procedures regularly. Consequently, it is desirable to reduce or eliminate the X-ray dose during these procedures.

Another limitation on the use of X-ray fluoroscopes is that the technique is projective in nature and produces a single two-dimensional image. Information concerning the depth of an object within the field-of-view is not available to the operator. It is often desirable to obtain this information during surgical procedures.

Several method of using rf signals to track a device in the body have been disclosed in U.S. patent applications TRACKING SYSTEM TO MONITOR THE POSITION AND ORIENTATION OF A DEVICE WITH RADIOFREQUENCY FIELD GRADIENTS Ser. No. 07/753,565 by C. Dumoulin, R. Darrow, J. Schenck and S. Souza; TRACKING SYSTEM TO MONITOR THE POSITION AND ORIENTATION OF A DEVICE WITH RADIOFREQUENCY FIELDS Ser. No. 07/753,563 by C. Dumoulin, R. Darrow, J. Schenck and P. Roemer; STEREOSCOPIC X-RAY FLUOROSCOPY SYSTEM USING RADIOFREQUENCY FIELDS Ser. No. 07/753,564 by C. Dumoulin and R. Darrow; AUTOMATIC GANTRY POSITIONING FOR IMAGING SYSTEMS Ser. No. 07/753,567 by C. Dumoulin and R. Darrow; and MULTI-PLANAR X-RAY FLUOROSCOPY SYSTEM USING RADIOFREQUENCY FIELDS Ser. No. 07/753,566 by R. Darrow and C. Dumoulin all field on Sep. 3, 1991. These methods do not require the use of X-rays but employ rf transmitting and receiving apparatus to track a device in a body.

Currently, there is a need for a simple method of tracking a device in an imaging system which requires little modification to the existing system and does not require X-ray radiation for tracking.

SUMMARY OF THE INVENTION

Tracking of catheters and other devices being positioned within a body, without using X-rays, is accomplished by using a magnetic resonance (MR) imaging system comprised of a magnet, pulsed magnetic field gradient system, a radio-frequency transmitter, a radio-frequency receiver and a controller. A device to be tracked is modified by attaching to it a small radio-frequency (rf) coil near its end. A subject is placed in the magnet bore and the device is introduced into the subject. The MR system generates a series of rf and magnetic field gradient pulses transmitted into the subject which induce a resonant MR response signal from selected nuclear spins within the subject. This response signal induces current in the rf coil attached to the device. Since the rf coil is small, its region of sensitivity is limited. Consequently, only nuclear spins in the immediate vicinity of the rf coil are detected by the rf coil. A receiver system receives the detected MR response signal and demodulates, amplifies, filters and digitizes the MR response signal, which is then stored as data by a controller. Data are acquired during the sequential application of magnetic field gradients in three mutually orthogonal directions. These gradients cause the frequency of the detected signal to be directly proportional to the position of the rf coil along each applied gradient. The digitized data are then processed using Fourier transformations to calculate the position of the rf coil in three dimensions. This positional information can then be superimposed on an MR image of the region of interest or otherwise made available to the operator of the MR system.

OBJECTS OF THE INVENTION

It is an object of the present invention to provide a system for tracking a device within a body without using X-rays for tracking.

It is another object of the present invention to provide a method of tracking a device in a living body during an MR examination.

It is another object of the present invention to provide an interactive image of a device superimposed upon another image.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

DETAILED DESCRIPTION OF THE INVENTION

Figure 1:
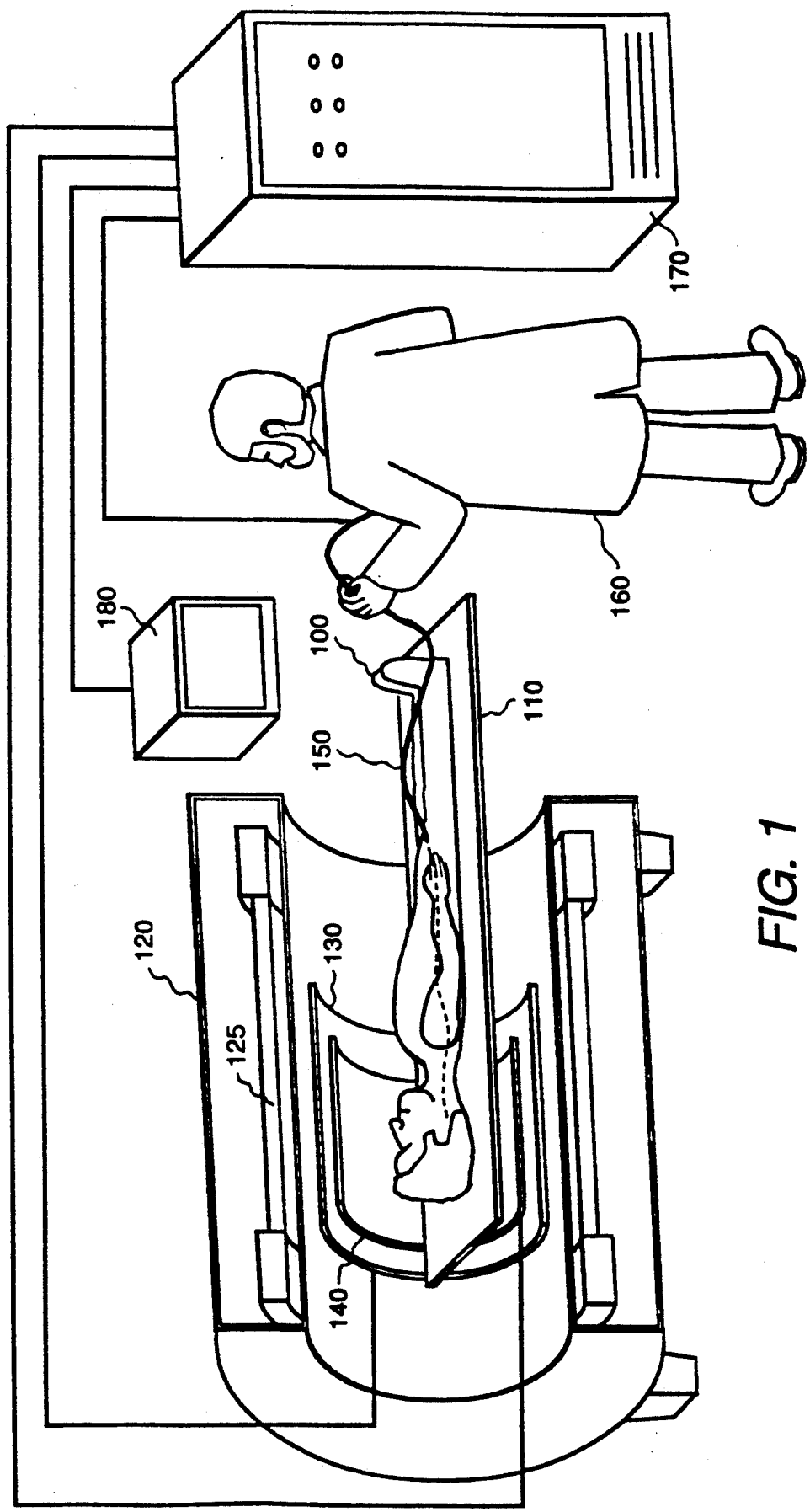
FIG. 1 is a perspective view of one embodiment of the present invention in operation tracking the location of a device in a subject.

In FIG. 1, a subject 100 on a support table 110 is placed in a homogeneous magnetic field generated by a magnet 125 in magnet housing 120. Magnet 125 and magnet housing 120 having cylindrical symmetry and are shown sectioned in half to reveal the position of subject 100. A region of subject 100 into which a device 150, shown as a catheter, is inserted, is located in the approximate center of the bore of magnet 125. Subject 100 is surrounded by a set of cylindrical magnetic field gradient coils 130 which create magnetic field gradients of predetermined strength at predetermined times. Gradient coils 130 generate magnetic field gradients in three mutually orthogonal directions.

An external coil 140 also surrounds the region of interest of subject 100. Coil 140 is shown as a cylindrical external coil which has a diameter sufficient to encompass the entire subject. Other geometries, such as smaller cylinders specifically designed for imaging the head or an extremity can be used instead. Non-cylindrical external coils, such as surface coils, may alternatively be used. External coil 140 radiates radio frequency energy into subject 100 at predetermined times and with sufficient power at the predetermined frequency that nutates nuclear magnetic spins of subject 100 in a fashion well known to those skilled in the art. The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

Device 150 is inserted into subject 100 by an operator 160, and may be a guide wire, a catheter, an endoscope, a laparoscope, a biopsy needle or similar device. This device contains an rf coil which detects MR signals generated in the subject responsive to the radio frequency field created by external coil 140. Since the rf coil is small, the region of sensitivity is also small. Consequently, the detected signals have Larmor frequencies which arise only from the strength of the magnetic field in the immediate vicinity of the coil. These detected signals are sent to an imaging and tracking unit 170 where they are analyzed. The position of device 150 is determined in imaging and tracking unit 170 and is displayed on a display means 180. In the preferred embodiment of the invention the position of device 150 is displayed on display means 180 by superposition of a graphic symbol on a conventional MR image driven by a superposition means (not shown). In alternative embodiments of the invention, the graphic symbol representing device 150 is superimposed on diagnostic images obtained with other imaging systems such as a computed tomography (CT) scanner, a Positron Emission Tomography system or ultrasound scanner. Since CT scanners (and other X-ray imaging means), Positron Emission Tomography systems and Ultrasound scanners do not interfere the steps of MR tracking, they may be operated during the steps of MR tracking. The steps of magnetic resonance (MR) imaging, however, are interleaved with the steps of MR tracking to create an image at substantially the same time tracking is being performed. Other embodiments of the invention display the position of the device numerically or as a graphic symbol without reference to a diagnostic image.

Figure 2:
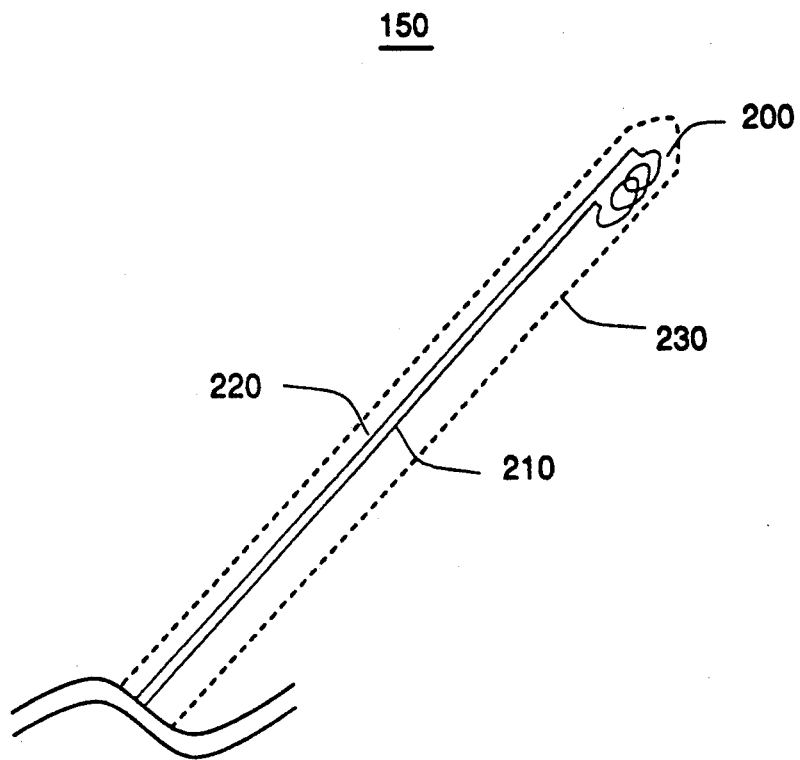
FIG. 2 is a schematic illustration showing an rf coil incorporated into a medical device intended to be inserted into the body of a subject.

An embodiment of device 150 is shown in greater detail in FIG. 2. A small rf coil 200 is electrically coupled to the MR system via conductors 210 and 220. In the preferred embodiment of this invention, conductors 210 and 220 from a co-axial pair. Conductors 210 and 220 and rf coil 200 are encased in an outer shell 230 of device 150. The MR signal arising from the tissue surrounding device 150 is detected.

Figure 3:
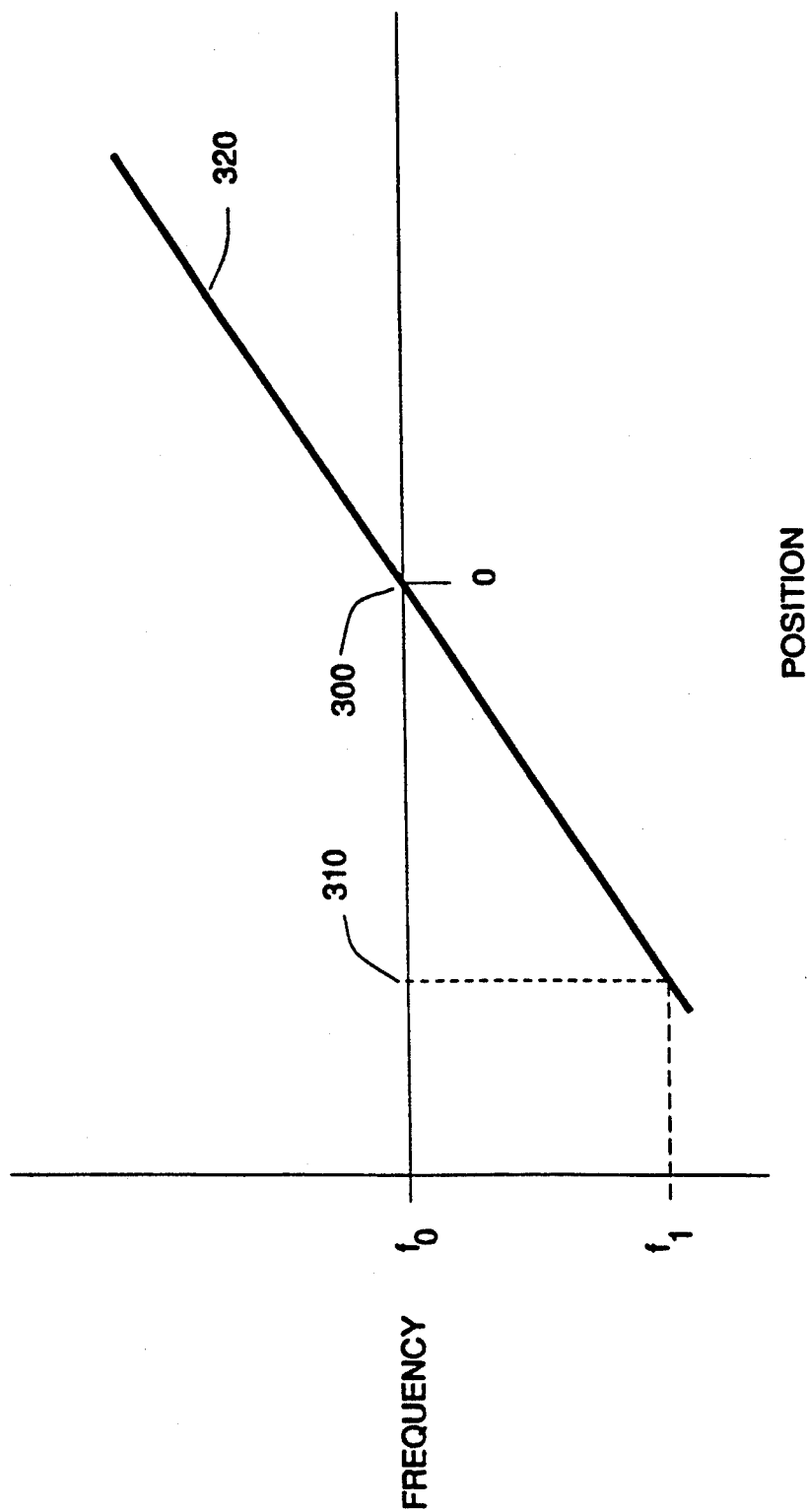
FIG. 3 is a graph of MR resonance frequency vs. position along a single axis in the presence of an applied magnetic field gradient.

Referring now to FIG. 3, the Larmor frequency of a spin is shown to be substantially proportional to its position when a magnetic field gradient is applied. A spin located at a center point 300 of gradient coil 130 (FIG. 1) precesses at a Larmor frequency $f_0$. The Larmor frequency $f_0$ at point 300 is determined solely by the static magnetic field generated by magnet 125 (FIG. 1). A spin at a location 310 has a Larmor frequency $f_1$ determined by the sum of the static magnetic field and the additional magnetic field created at that location by magnetic field gradient coil 130 (FIG. 1). Since the gradient coil response 320 is substantially linear, the Larmor frequency of the spin is substantially proportional to position.

Figure 4A:
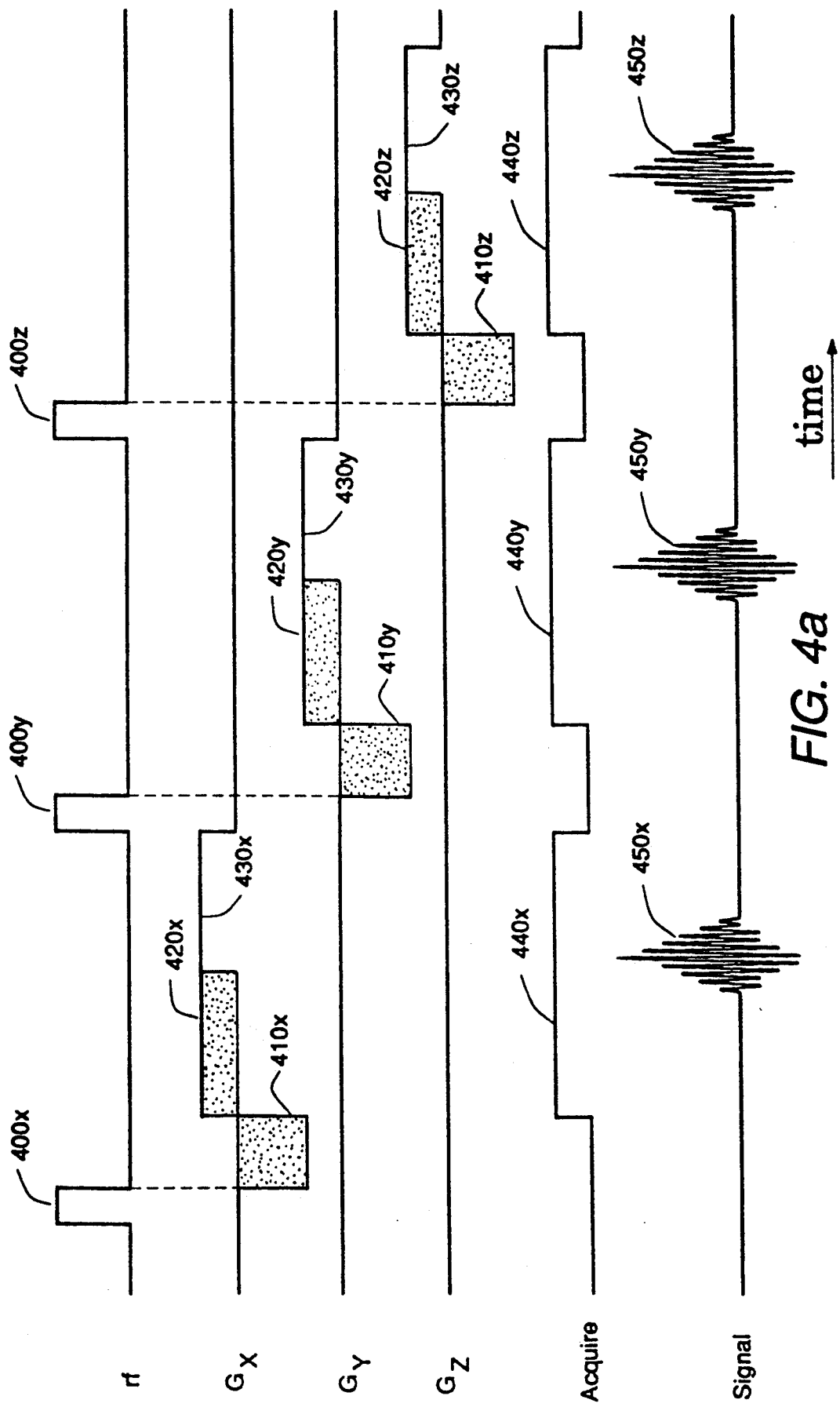
FIG. 4a is a timing diagram showing the relationships between rf pulses, magnetic field gradient pulses, data acquisition and detected signals in a first embodiment of the invention.

The MR response signal detected by rf coil 200 encased in device 150 as shown in FIG. 2 is generated in response to the rf and magnetic field gradient pulses of the MR system. A presently preferred embodiment of the pulse timing is illustrated in FIG. 4a. In this timing diagram, a first broadband rf pulse 400x excites all spins of the subject within external coil 140 of FIG. 1. Shortly after first broadband rf pulse 400x, a first magnetic field gradient pulse 410x is applied in a predetermined direction. Gradient pulse 410x dephases spin magnetization to a degree proportional to the position of the spin along the applied field gradient (shown here to be in the X direction). Gradient pulse 410x is followed by a second magnetic field gradient pulse 420x having an opposite polarity to form a bi-lobed magnetic field gradient pulse. The product of the magnetic field gradient magnitude and duration of the gradient pulses (i.e., the areas of the regions shown in gray) are chosen to be substantially identical for the first and second gradient pulses. The amplitude of second magnetic field gradient pulse 420x is maintained, effectively creating a third pulse 430x having an area substantially identical to that of second pulse 420x. Note that second 420x and third 430x gradient pulses in fact form a single pulse. This single pulse has been divided in two pulses solely for purposes of identification. At the end of the second gradient pulse, all spins in subject 100 are substantially in phase. Third gradient pulse 430x causes additional dephasing of the MR signal.

During second gradient pulse 420x and third gradient pulse 430x, a data acquire signal 440x causes a first MR response signal 450x to be received by rf coil 200 (FIG. 2). MR response signal 450x is digitized and stored in imaging and tracking unit 170 (FIG. 1). MR response signal 450x has a maximum amplitude substantially at the end of second gradient pulse 420x and a Larmor frequency which is substantially proportional to the position of device 150 (FIG. 1) along the direction of the applied magnetic field gradient. The frequency of MR response signal 450x is used to measure the position of device 150 (FIG. 1) in a first direction which is parallel to the direction of the applied field gradient, $G_x$.

A second broadband rf pulse 400y is applied immediately after acquisition of first MR response signal 450x. In a manner analogous to that used to determine the position of device 150 of FIG. 1 in the first direction, a fourth, fifth and sixth gradient pulse 410y, 420y, 430y, respectively, are applied in a second direction (here indicated to be in the Y direction) substantially orthogonal to the first direction. A data acquire signal 440y is generated during the period of the fifth and sixth gradient pulses 420y, 430y to cause a second MR response signal 450y to be digitized and stored in imaging and tracking unit 170 of FIG. 1. After detection of MR response signal 450y, a third broadband rf pulse 400z is applied and a seventh, eighth and ninth gradient pulse 410z, 420z, 430z, respectively, are applied in a third direction (shown here to be in the Z direction) substantially orthogonal to the first and second directions. A data acquire signal 440z is generated during the period of the eighth and ninth gradient pulses to cause a third MR response signal 450z to be digitized and stored in imaging and tracking unit 170 of FIG. 1.

After detection of third MR response signal 450z the entire pulse sequence shown in FIG. 4a is repeated until tracking of the device is no longer desired. Alternatively, the entire pulse sequence shown in FIG. 4a is periodically interleaved with an imaging pulse sequence acquiring MR response signals from a conventional imaging rf coil to effect substantially simultaneous imaging of the subject and tracking of the device.

In another embodiment of this invention, the durations of third, sixth and ninth gradient pulses 430x, 430y, 430z, respectively, are extended to ensure that the signals are completely dephased before application of the next broadband rf pulse. This minimizes artifacts arising from spin phase coherence from multiple rf pulses. A second method of minimizing phase coherence is to use random phases in the MR system rf receiver and transmitter for each rf pulse.

In still another embodiment of this invention, the first, fourth and seventh gradient pulses 410x, 410y, 410z, respectively, are reduced in amplitude and/or duration without changing the remaining gradient pulses. This reduces the amount of dephasing each signal experiences prior to the data acquisition period and thus shifts the instant of maximum signal, but not its frequency. Reducing the duration of the first, fourth and seventh gradient pulses 410x, 410y, 410z, respectively, permits an advantageous reduction in the rf pulse interval.

Figure 4B:
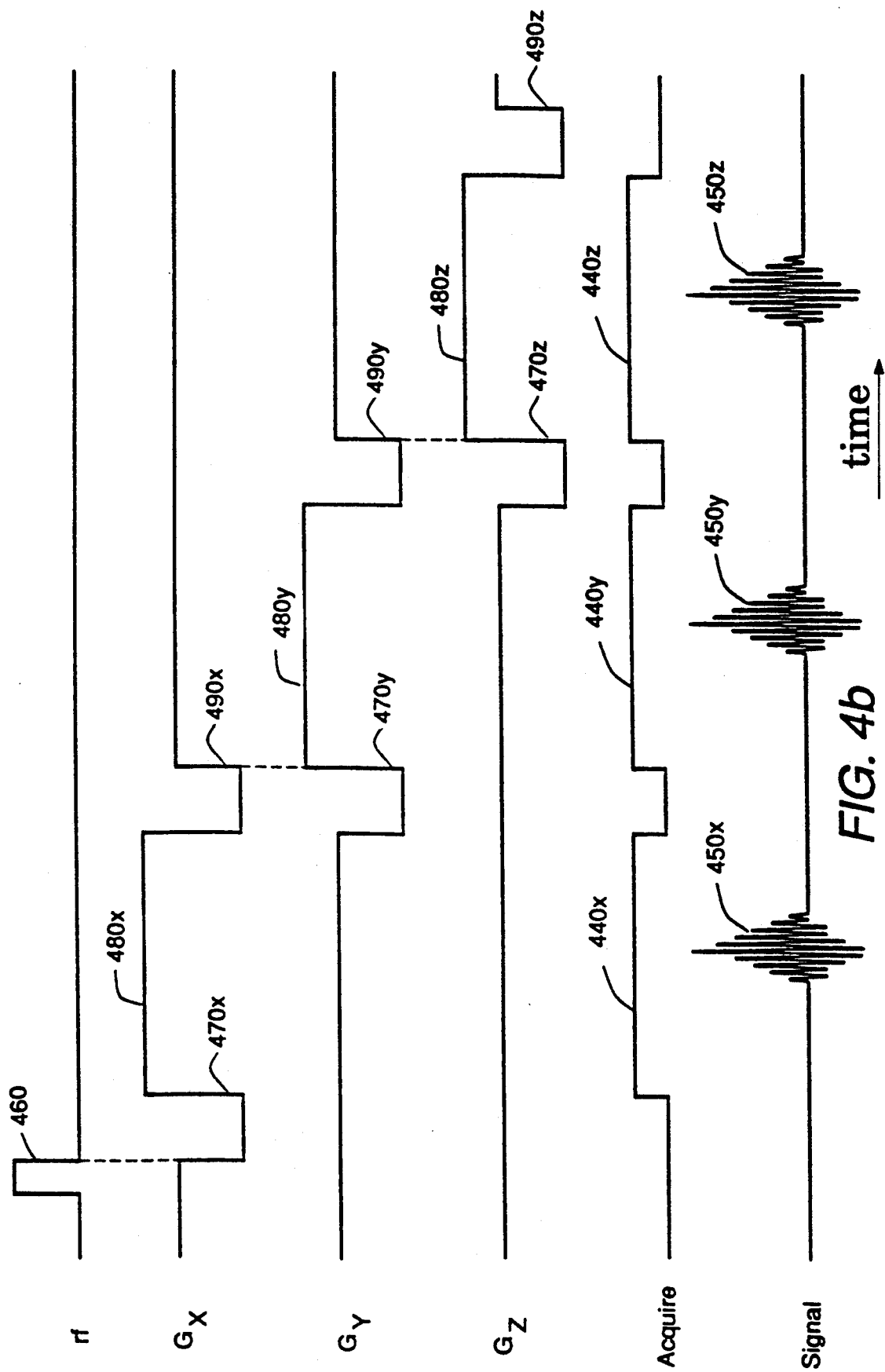
FIG. 4b is a timing diagram showing the relationships between rf pulses, magnetic field gradient pulses, data acquisition and detected signals in a second embodiment of the invention.

The pulse sequence shown in FIG. 4a can be modified to become the pulse sequence shown in FIG. 4b. In this embodiment of the invention only a single broadband rf pulse 460 is used. Three dephasing magnetic field gradient pulses 470x, 470y, 470z are used to dephase spins along the three mutually orthogonal axes. Readout magnetic field gradient pulses 480x, 480y, 480z are applied after each dephasing gradient pulse. Data acquire signals 440x, 440y, 440z are applied as in the pulse sequence of FIG. 4a to cause signals 450x, 450y, 450z to be collected by the MR system. Rephasing magnetic field gradient pulses 490x, 490y, 490z are employed to cancel the phase changes caused by the readout dephasing gradient pulses 470x, 470y, 470z, respectively, and the readout gradient pulses 480x, 480y, 480z, respectively. This is accomplished by making the sum of the three gradient pulse areas (i.e., the product of the pulse duration and amplitude) equal to zero. It will be noted that each set of readout dephasing, readout and readout rephasing gradient pulses form a tri-lobed gradient pulse. It will also be noted that the dephasing pulse on one axis can be applied in the same time period as the rephasing pulse on another axis.

Figure 5:
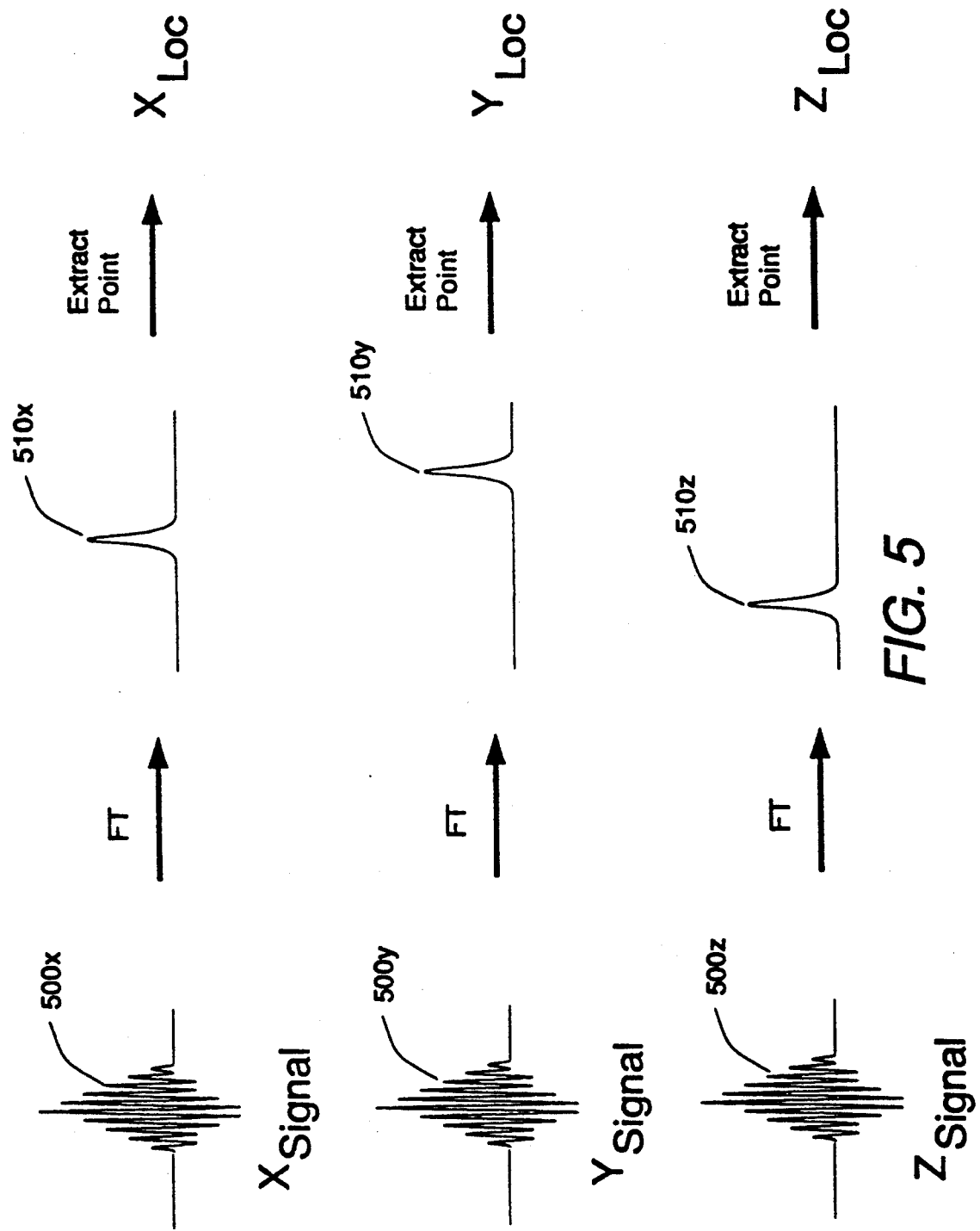
FIG. 5 is a diagram illustrating the steps required to determine the location of an rf coil.

Referring now to FIG. 5, the steps executed by imaging and tracking unit 170 of FIG. 1 to determine the position of device 150 of FIG. 1 from the detected signals are illustrated. Three signals 500x, 500y, 500z are detected by the MR system responsive to the pulse sequence shown in either FIG. 4a or FIG. 4b. Signals 500x, 500y, 500z contain information about the position of the device in the X, Y and Z directions, respectively. This frequency information is extracted by subjecting each signal to a Fourier transformation (FT) which converts the time dependency of the data to frequency dependency. The frequency dependent data sets 510x, 510y, 510z each contain a single maximum which corresponds to a position of rf coil 200 of FIG. 2 in each of the three mutually orthogonal directions. The location of the maximum value in each data set is extracted and passed to the display means 180 (FIG. 1) for presentation to the operator.

In one embodiment of the invention the polarity of all gradient pulses is reversed for each repetition of the sequence of FIG. 4a or FIG. 4b. The acquired data are processed in the manner as summarized by FIG. 5 but an average position obtained with positive and negative gradient polarities is calculated and displayed. The position of device 150 of FIG. 1 obtained in this manner is insensitive to differences in chemical shift which might occur as the device passes different types of tissue.

Figure 6:
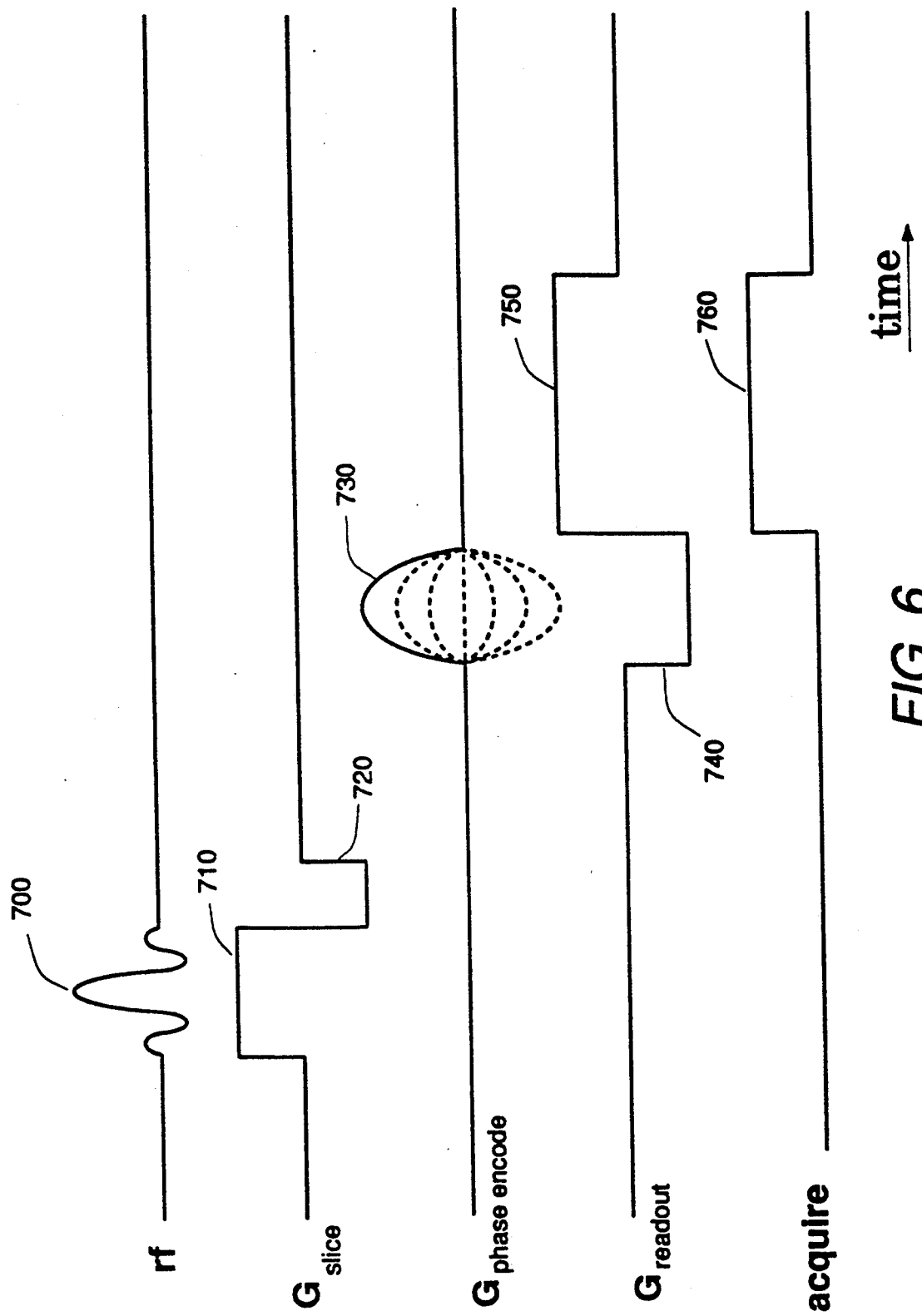
FIG. 6 is a pulse timing diagram showing the relationships between rf pulses, magnetic field gradient pulses and data acquisition for the purpose of MR image formation.

FIG. 6 is an amplitude vs. time diagram of an MR pulse sequence for an alternative embodiment of the present invention. A conventional MR image is obtained using a gradient recalled spin-warp pulse sequence. Other imaging pulse sequences such as a spin-echo spin warp, projection reconstruction, echo-planar technique or the like can alternatively be used. In the present embodiment, a slice selective rf pulse 700 is applied concurrently with application of a slice selection magnetic field gradient pulse 710, causing spins to become excited in a selected volume of the subject. This volume is substantially a slab of predetermined thickness. After application of slice selective rf pulse 700, the excited spins are out of phase. The spins are refocused with a refocusing gradient pulse 720 having a polarity opposite that of slice selection gradient pulse 710. The product of the gradient magnitude and pulse duration of refocusing pulse 720 is substantially equal to half the product of the gradient magnitude and pulse duration of slice selective gradient pulse 710.

After completion of slice selective gradient pulse 710, a phase-encoding magnetic field gradient pulse 730 is applied on an axis orthogonal to the slice selective gradient axis. Phase-encoding gradient pulse 730 changes the phase of the spins in the subject by an amount proportional to the position of the spins along the axis of applied phase-encoding gradient pulse 730. After completion of slice selective gradient pulse 730, a readout dephasing magnetic field gradient pulse 740 is applied to change the phase of spins in the subject by an amount proportional to the position of the spins along the axis of applied readout gradient pulse 740. Slice-selective refocusing pulse 720, phase-encoding pulse 730 and readout dephasing pulse 740 can be applied simultaneously or during non-overlapping time intervals.

After slice-selective refocusing pulse 720, phase-encoding pulse 730 and readout dephasing pulse 740 have been applied, a readout magnetic field gradient pulse 750 is applied along the same axis as readout dephasing pulse 740. Readout pulse 750 has a polarity opposite that of readout dephasing gradient pulse 740. Simultaneously with application of readout pulse 750, a data acquire signal 760 causes the MR system to acquire data.

The pulse sequence shown in FIG. 6 is repeated to cause the collection of a two dimensional raw data matrix having rows and columns. The rows of data are acquired responsive to readout gradient pulse 750 during a single repetition. The columns contain data acquired responsive to successive repetitions of the pulse sequence. Each repetition of the pulse sequence is performed with substantially identical magnetic field gradient pulses except for phase-encoding gradient 730 which is uniformly decremented for each repetition.

A two-dimensional Fourier transform is applied to the two-dimensional raw data matrix, resulting in an image. This image contains the spatial distribution of intensity in the readout and phase encoding dimensions. The signals received from rf coil 200 contained within device 150 of FIG. 2 are limited to the immediate vicinity of the coil. Consequently, the signal from the rf coil is manifested as a bright spot in the image. Tracking of device 150 can be accomplished by obtaining sequential images and monitoring the location of the bright spot.

Figure 7:
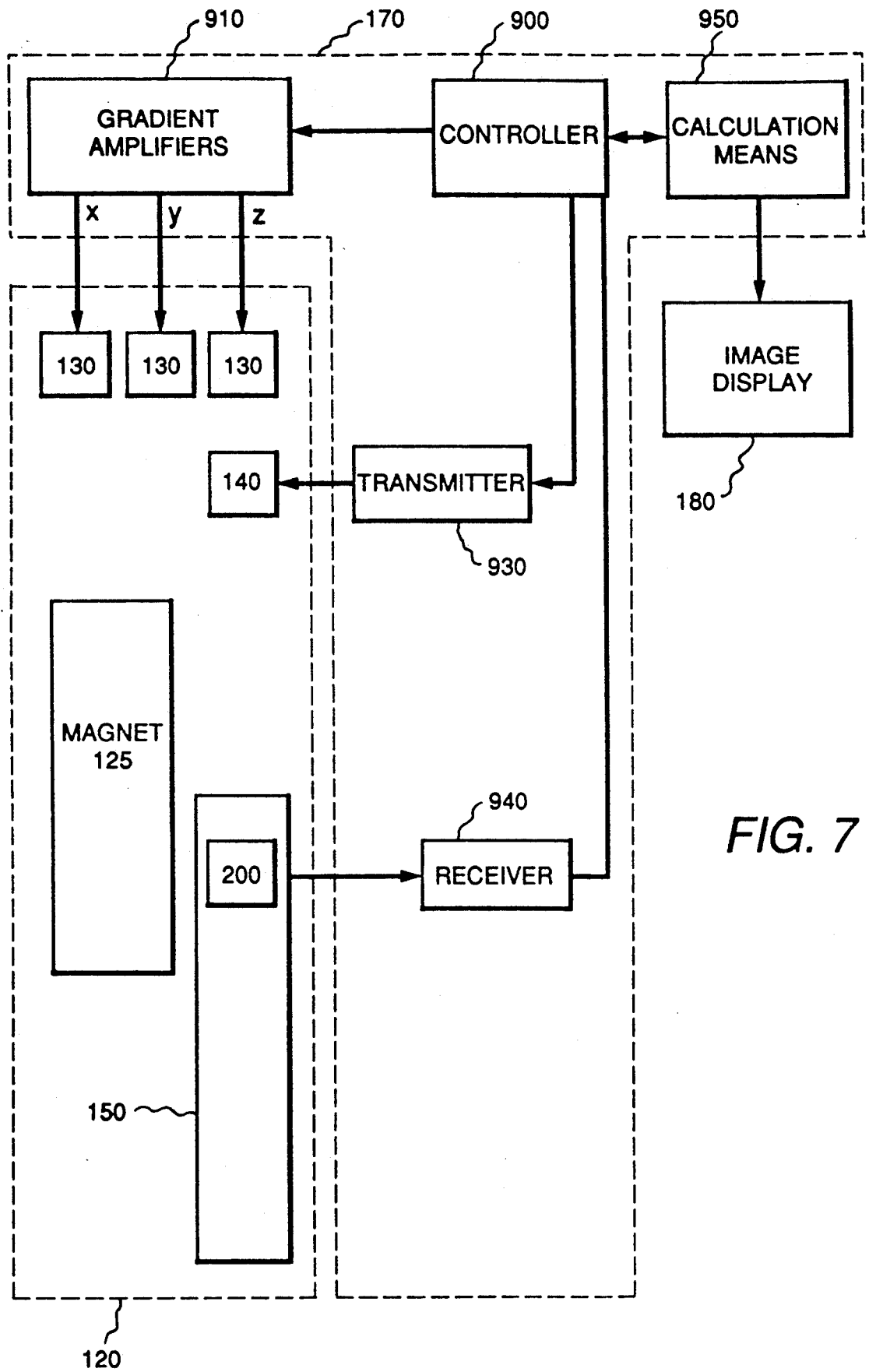
FIG. 7 is a block diagram of an MR imaging system suitable for device tracking using the present invention.

FIG. 7 is a block diagram of an MR system suitable for imaging and device tracking. The system comprises a controller 900 which provides control signals to a set of magnetic field gradient amplifiers 910. These amplifiers drive magnetic field gradient coils 130 situated within the magnet enclosure 120 (FIG. 1). Gradient coils 130 are capable of generating magnetic field gradients in three mutually orthogonal directions. Controller 900 also generates signals which are sent to a transmitter means 930. These signals from controller 900 cause transmitter means 930 to generate rf pulses at a selected frequency and of suitable power to nutate selected spins in the region of the subject situated within external coil 140 which, in turn, is situated within the bore of magnet 125. An MR signal is induced in rf coil 200, (FIG. 2) connected to a receiver means 940. Receiver means 940 processes the MR signal by amplifying, demodulating, filtering and digitizing it. Controller 900 also collects signals from receiver means 940 and propagates it to a calculation means 950 where it is processed. Calculation means 950 applies a Fourier transformation to the signal received from controller 900 to arrive at a position of coil 200. The results calculated by calculation means 950 are displayed on an image display means 180.

MR imaging and device tracking can be performed with much of the same hardware system if desired. It is also possible to interleave image acquisition with tracking so that both are performed approximately at the same time. Alternatively, simultaneous tracking and imaging can be done without interleaving by analyzing the gradient waveforms of an imaging procedure and the MR response signal detected by rf coil 200 within device 150 to determine the location of device 150.

In a preferred embodiment of the invention, rf coil 200 located within device 150 performs a receive function. Reciprocity between the transmit and receive coils exists, however, and tracking systems in which rf coil 200 in device 150 is used to transmit rf energy, and external coil 140 is used to receive the MR response signal are possible.

Figure 8:
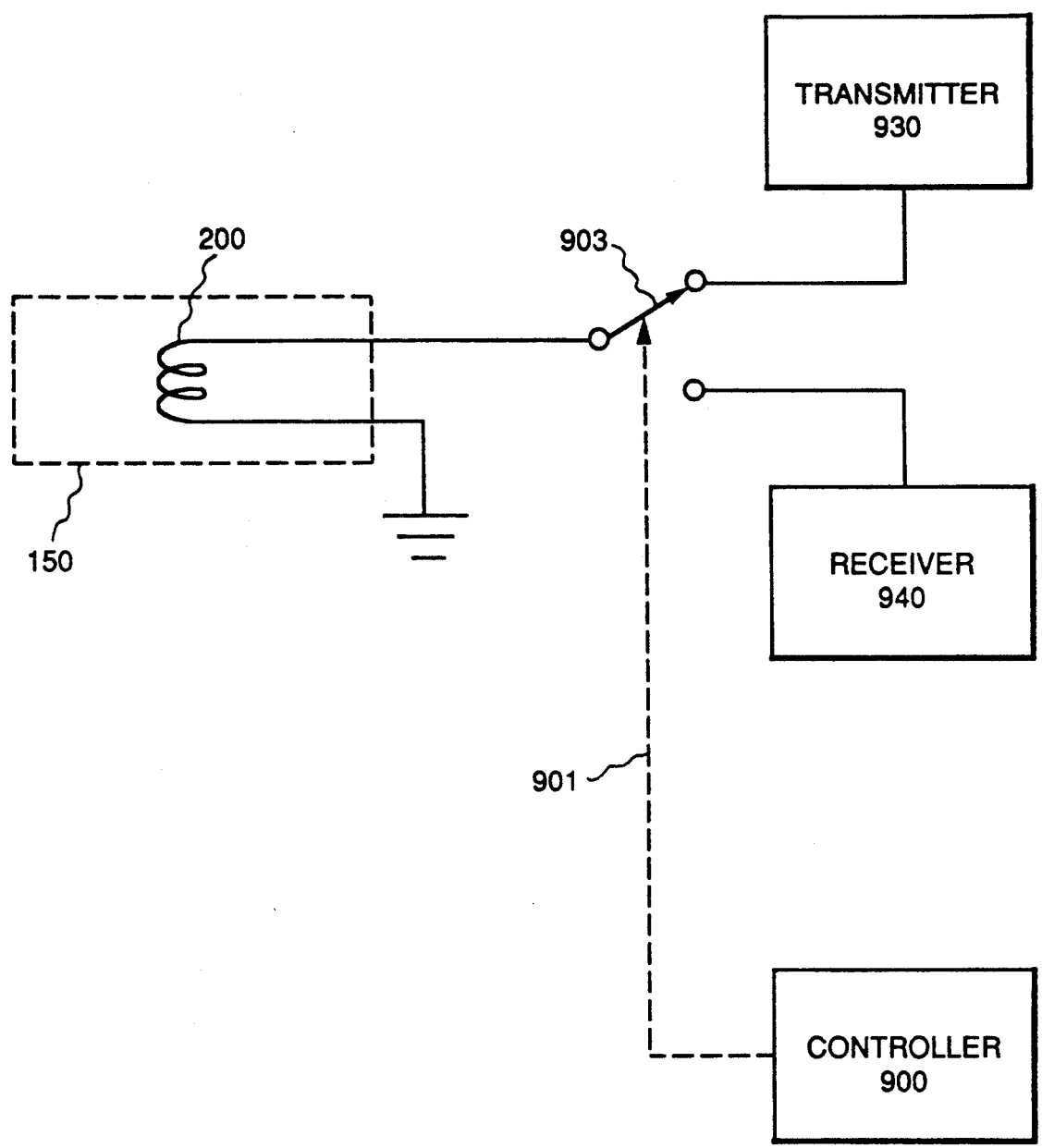
FIG. 8 is a partial block diagram of another embodiment of a tracking system according to the present invention.

In another embodiment of the invention, rf coil 200 may be used to alternately transmit and receive rf energy as shown in FIG. 8. Controller 900 activates a switch 903 through line 901 to connect coil 200 to transmitter 930 for transmitting RF energy into the subject. Conversely, controller 900 activates a switch 903 to connect coil 200 to receiver 940 for receiving RF energy from the subject.

While several presently preferred embodiments of the novel MR tracking system have been described in detail herein, many modifications and variations will now become apparent to those skilled in the art. It is, therefore, to be understood that the appended claims are intended to cover all such modifications and variations as fall within the true spirit of the invention.

What is claimed is:

1. A real-time magnetic resonance (MR) tracking system comprising:
    a) an invasive device adapted to be inserted into a subject;
    b) static magnetic field means for applying a homogeneous magnetic field having substantially uniform amplitude over the subject;
    c) radiofrequency (rf) transmitter means for transmitting rf energy of a selected duration, amplitude and frequency into the subject to cause nutation of a selected ensemble of spins in the subject;
    d) gradient means adapted for varying the amplitude of the magnetic field in at least one spatial dimension over the subject over time causing the selected ensemble of spins to emit an MR response signal;
    e) detection means attached to the invasive device adapted for detecting the MR response signal from the selected ensemble of spins within the subject;
    f) calculation means responsive to the detection means adapted for calculating a location of the invasive from the detected MR response signal;
    g) controller means coupled to the rf transmitter means, the detection means, the calculation means and the gradient means adapted for activating the rf transmitter means, the detection means, the calculation means and the gradient means according to a desired MR tracking sequence repeatedly for the purpose of tracking the invasive device in real-time; and
    h) display means responsive to the calculation means adapted for displaying the location of the invasive to an operator.

2. A method for tracking a location of an invasive device in real-time within a subject employing magnetic resonance (MR) comprising the steps of:
    a) applying a homogeneous magnetic field having substantially uniform amplitude over said subject;

b) transmitting radiofrequency (rf) energy of a selected duration, amplitude and frequency into said subject to cause nutation of a selected ensemble of spins within said subject;

c) varying amplitude of the magnetic field in at least one spatial dimension over said subject over time causing the selected ensemble of spins to emit an MR response signal;

d) detecting the MR response signal from the selected ensemble of spins within the subject through a coil attached to said invasive device;

e) processing the detected MR response signal;

f) calculating a location of said invasive device in real-time from the processed MR response signal; and g) displaying the location of said invasive device to an operator.

3. The method for tracking as recited in claim 2 further comprising the steps of:

a) acquiring a medical diagnostic image of said subject; and b) superimposing a symbol on the medical diagnostic image at a position representing the calculated location of said invasive device.

4. The method for tracking as recited in claim 3 wherein the steps of tracking are time-multiplexed with the step of acquiring a medical diagnostic image.

5. The method for tracking as recited in claim 2, wherein the step of detecting the MR response signal occurs simultaneously with the step of varying the amplitude of the magnetic field.

6. The method for tracking as recited in claim 2, wherein the step of calculating a location of said invasive device further includes the step of a Fourier transforming the MR response signal mapping time dependency to frequency dependency, and converting the frequency dependency to a location.

7. The method for tracking as recited in claim 2 wherein:

a) the step of transmitting rf energy comprises applying a non-selective rf pulse to said subject;

b) the step of varying amplitude of the magnetic field comprises applying a first dephasing magnetic field gradient lobe and applying a first readout magnetic field gradient lobe having a polarity opposite the first dephasing magnetic field gradient lobe to said subject in a first selected direction; and c) the step of detecting the MR response signal comprises detecting the MR response signal concurrently with the application of the first readout magnetic field gradient lobe to allow real-time localization in the first selected direction.

8. The method for tracking as recited in claim 7 further comprising the steps of:

a) applying a second non-selective rf pulse to said subject;

b) applying a second dephasing magnetic field gradient lobe and applying a second readout magnetic field gradient lobe having a polarity opposite the second dephasing magnetic field gradient lobe to said subject in a second selected direction substantially orthogonal to the first selected direction; and c) detecting a second MR response signal concurrently with application of second readout magnetic field gradient lobe to allow real-time localization in the first, and second selected directions.

9. The method for tracking as recited in claim 8 further comprising the steps of:

a) applying a third non-selective rf pulse to said subject;

b) applying a third dephasing magnetic field gradient lobe and applying a third readout magnetic field gradient lobe having a polarity opposite the third dephasing magnetic field gradient lobe to said subject in a third selected direction substantially orthogonal to the first and second selected directions; and c) detecting a third MR response signal concurrently with the application of the third bi-lobed readout magnetic field gradient lobe to allow real-time localization in the first, second and third selected directions.

10. The method for tracking as recited in claim 9 further comprising the steps of:

a) applying a fourth non-selective rf pulse to said subject;

b) applying to said subject a fourth dephasing magnetic field gradient lobe and applying a fourth readout magnetic field gradient lobe having a polarity to the fourth readout magnetic field gradient lobe in the first selected direction;

c) detecting a fourth MR response signal concurrently with the application of the fourth readout magnetic field gradient lobe to allow localization in the first selected direction;

d) calculating, from the detected fourth MR response signal, a location offset in the first selected direction of said invasive device;

e) applying a fifth non-selective rf pulse of said subject;

f) applying to said subject a fifth dephasing magnetic field gradient lobe and applying a fifth readout magnetic field gradient lobe having a polarity opposite to the fifth readout magnetic field gradient lobe in the second selected direction substantially orthogonal to the first selected direction;

g) detecting a fifth MR response signal concurrently with step "f" to allow real-time allow localization in the first and second selected directions;

h) calculating, from the detected fifth MR response signal, a location offset in the second selected direction of said invasive device;

i) applying a sixth non-selective rf pulse to said subject;

j) applying to said subject a sixth dephasing magnetic field gradient lobe and applying a sixth readout magnetic field gradient having a polarity opposite to the sixth readout magnetic field gradient lobe in the third selected direction substantially orthogonal to the first and second selected directions;

k) detecting a sixth MR response signal concurrently with step "j" to allow real-time localization in the first, second and third selected directions;

l) calculating, from the detected sixth MR response signal, a location offset in the third selected direction of said invasive device; and m) subtracting the location offset in the first, second and third selected directions from the location of the invasive device to provide an adjusted location that is relatively insensitive to chemical shift, susceptibility and resonance offset differences within said subject.

11. The method for tracking as recited in claim 7 further comprising the steps of:

a) applying a first rephasing magnetic field gradient lobe having a polarity opposite that of the first readout magnetic field gradient lobe;

b) applying a second dephasing magnetic field gradient lobe and applying a second readout magnetic field gradient lobe having a polarity opposite the second dephasing magnetic field gradient lobe to said subject in a second selected direction substantially orthogonal to the first selected direction; and c) detecting a second MR response signal concurrently with the application of the second readout magnetic field gradient lobe to allow real-time localization in both the first and second selected directions.

12. The method for tracking as recited in claim 11 further comprising the steps of:

a) applying a second rephasing magnetic field gradient lobe having a polarity opposite that of the second readout magnetic field gradient lobe;

b) applying a third dephasing magnetic field gradient lobe and applying a third readout magnetic field gradient lobe having a polarity opposite the third dephasing magnetic field gradient lobe to said subject in a third selected direction substantially orthogonal to the first and second selected directions; and c) detecting a third MR response signal concurrently with the application of the third readout magnetic field gradient lobe to allow real-time localization in the first, second and third selected directions; and d) applying a third rephasing magnetic field gradient lobe having a polarity opposite that of the third readout magnetic field gradient lobe.

13. A real-time magnetic resonance (MR) tracking system comprising:

a) an invasive device adapted to be inserted into a subject;

b) static magnetic field means adapted for applying a homogeneous magnetic field having substantially uniform amplitude over the subject;

c) radiofrequency (rf) transmitter means attached to the invasive device adapted for transmitting rf energy of a selected duration, amplitude and frequency into the subject to cause nutation of a selected ensemble of spins in the subject;

d) gradient means adapted for varying the amplitude of the magnetic field in at least one spatial dimension over the subject over time causing the selected ensemble of spins to emit an MR response signal;

e) detection means adapted for detecting the MR response signal from the selected ensemble of spins within said subject;

f) calculation means responsive to the detection means adapted for calculating a location of the invasive device from the detected MR response signal;

g) controller means coupled to the rf transmitter means, the detection means, the calculation means and the gradient means adapted for activating the rf transmitter means, the detection means, the calculation means and the gradient means according to a desired MR tracking sequence repeatedly for the purpose of tracking the invasive device in real-time; and h) display means responsive to the calculation means for displaying the location of said device to an operator.

14. The real-time MR tracking system recited in claim 13, wherein the detection means comprises an rf coil affixed to the invasive device for receiving the MR response signal.

15. A method for tracking a location of an invasive device in real-time within a subject employing magnetic resonance (MR) comprising the steps of:

a) applying a homogeneous magnetic field having substantially uniform amplitude over said subject;

b) transmitting radiofrequency (rf) energy of a selected duration, amplitude and frequency from a coil attached to said invasive device into said subject to cause nutation of a selected ensemble of spins within said subject;

c) varying amplitude of the magnetic field in at least one spatial dimension over said subject over time;

d) detecting an MR response signal with an external coil surrounding said subject from the selected ensemble of spins within said subject;

e) processing the detected MR response signal;

f) calculating a location of said invasive device from the processed MR response signal; and g) displaying the location of said invasive device to an operator.

* * * * *